United States Patent [19]

Ng et al.

[11] Patent Number: 4,763,183
[45] Date of Patent: Aug. 9, 1988

[54] SEMICONDUCTOR-ON-INSULATOR (SOI) DEVICES AND SOI IC FABRICATION METHOD

[75] Inventors: Kwok K. Ng, Union; Simon M. Sze, Berkeley Heights, both of N.J.

[73] Assignee: American Telephone and Telegraph Co., AT&T Bell Laboratories, Murray Hill, N.J.

[21] Appl. No.: 921,899

[22] Filed: Oct. 24, 1986

Related U.S. Application Data

[63] Continuation of Ser. No. 636,730, Aug. 1, 1984, abandoned.

[51] Int. Cl.$^4$ .................... H01L 29/78; H01L 27/12; H01L 29/80; H01L 29/48
[52] U.S. Cl. .................... 357/23.7; 357/23.12; 357/4; 357/22; 357/15
[58] Field of Search .................... 357/23.7, 23.12, 4, 357/22, 15

[56] References Cited

U.S. PATENT DOCUMENTS

| | | | |
|---|---|---|---|
| 3,997,908 | 12/1976 | Schloetterer et al. | 357/23.7 |
| 4,053,916 | 10/1977 | Cricchi et al. | 357/23.7 |
| 4,571,609 | 2/1986 | Hatano | 357/23.12 |

FOREIGN PATENT DOCUMENTS 0042552 12/1981 European Pat. Off. ............ 357/23.7

OTHER PUBLICATIONS

McDowell, "Use of the MOS Substrate as a Control Element", IBM Technical Disclosure Bulletin, vol. 10, No. Dec. 1967, p. 1032.
Shinchi et al., "The Buried Oxide MOSFET-A New Type of High-Speed Switching Device", IEEE Transactions on Electron Devices, Oct. 1976, pp. 1190-1191.

Primary Examiner—Martin H. Edlow
Assistant Examiner—Robert P. Limanek
Attorney, Agent, or Firm—Bernard Tiegerman

[57] ABSTRACT

A new SOI device which permits both the kink effect to be avoided and threshold voltage to be regulated, as well as a new method for fabricating SOI ICs, is disclosed. The new device included an electrically conductive pathway extending from the active volume and terminating in a non-active region of the substrate of the device. A back-gate bias is communicated to, and kink-inducing charges are conducted away from, the active volume through the conductive pathway. The new fabrication methd permits SOI ICs to be fabricated using available circuit designs and pattern delineating apparatus, e.g., IC mask sets. This method involves the formation of a precursor substrate surface which includes islands of insulating material, each of which is encircled by a crystallization seeding area of substantially single crystal semiconductor material. The boundaries of the islands are defined with a first pattern delineating device, e.g., a mask, which, in terms of the pattern it produces, is substantially identical to a second pattern delineating device. The latter device is a component of pattern delineating apparatus used in forming an IC, e.g., an IC mask set, the component being used to delineate the device regions of the IC. A layer of non-single crystal semiconductor material is formed on the precursor substrate surface, and crystallized with little or no displacement of the islands. The pattern delineating apparatus is then used to form an IC in the crystallized material.

8 Claims, 4 Drawing Sheets

SEMICONDUCTOR-ON-INSULATOR (SOI) DEVICES AND SOI IC FABRICATION METHOD

This application is a continuation of application Ser. No. 636,730 filed Aug. 1, 1984 now abandoned.

BACKGROUND OF THE INVENTION

1. Field of the Invention

The invention pertains generally to semiconductor devices and, more particularly, to semiconductor-on-insulator devices.

2. Art Background

Semiconductor-on-insulator (SOI) devices are semiconductor devices which are formed on an electrically insulating region of a substrate. Such a region includes, for example, a layer of insulating material (material having a bandgap greater than about 3 eV), e.g., a layer of $SiO_2$, overlying semiconductor material such as silicon.

SOI devices offer several advantages over conventional semiconductor devices. For example, SOI devices offer the possibility of lower parasitic capacitances, and thus faster switching times. In addition, the undesirable phenomenon of latchup (regarding latchup, see, e.g., S. M. Sze, ed., *VLSI Technology*, McGraw Hill, New York, 1983, page 481), often exhibited by conventional CMOS (complementary metal-oxide-semiconductor) devices, is avoided by CMOS devices in an SOI configuration. SOI devices are also less susceptible to the adverse effects of ionizing radiation and thus are more reliable. Further, the possibility of achieving relatively high speed integrated circuits without using relatively small-dimension design rules, through the fabrication of multi-level integrated circuits, i.e., circuits where one layer of devices is fabricated on top of, and electrically connected to, an underlying layer of devices, is also offered by SOI technology.

While these advantageous properties of SOI devices result from the vertical dielectric isolation, this isolation also produces difficulties not encountered with conventional devices. In conventional devices, electrical interactions between the device substrate and the device active region, e.g., the current channel of a MOSFET (metal-oxide-semiconductor field effect transistor), are advantageously utilized. For example, accumulated charge in the device active region alters the device threshold voltage (the voltage at which, for example, the current channel of an enhancement-mode MOSFET begins to conduct current). However, this accumulated charge is readily removed through the substrate by applying an appropriate backgate bias, i.e., a voltage applied to the substrate which attracts the accumulated charge away from the active layer, into the substrate, and out through a conductive lead. For example, a negative voltage applied to the substrate attracts holes from the active layer into the substrate, while a positive voltage attracts electrons. Alternatively, it is possible to change the threshold voltage of a device, if desired, by applying a back-gate bias through the substrate to the active region.

In contrast, in an SOI device, the insulating region prevents both the conduction of charge from the active region into the substrate, and the application of a potential through the substrate to the active region. Thus, this lack of flexibility due to the SOI insulating region is often quite inconvenient. For example, during operation of an n-channel SOI MOSFET, holes continue to accumulate in the active layer of the device, between the source and drain, until the concomitant electric potential increases sufficiently to produce a shift in the threshold voltage of the device, with a resulting sudden increase, i.e., a kink, in the current conducted by the device. This "kink" introduces errors into the information being processed by the device.

The kink effect and threshold voltage have been controlled in both conventional and SOI devices by applying an appropriate voltage (a voltage which attracts kink-producing charge carriers) to a low resistance diffusion contact formed in the active layer(s) of a device. Often, to withdraw kink-producing charges, a conventional CMOS device includes a low resistance contact to one of the two types (n-channel or p-channel) of MOSFETs of the device, which either partially or completely encircles the one type of MOSFETs. However, the use of such contacts in any device, including an SOI device, is undesirable because the contacts occupy an excessive region of the substrate.

SOI fabrication techniques, such as the lateral seeding process, although advantageous, also present difficulties. In the lateral seeding process, as described by Lam et al, "Single Crystal Silicon-on-Oxide by a Scanning CW Laser Induced Lateral Seeding Process," *Journal of the Electrochemical Society*, 128, 1981 (1981), a scanning CW laser is used to propagate single crystal structure from a single crystal region through an adjacent layer of polycrystalline silicon (polysilicon) deposited onto a substrate surface which includes a region of (insulating) silicon dioxide. As noted by Lam et al, supra, at page 1983, the lateral seeding process displaces the oxide regions from their original positions. If the original positions of the oxide regions had corresponded to the positions of the components of an IC, as defined by a mask set, then, as stated by Lam et al, the displacement of the oxide regions would cause severe difficulty in placing each IC component in a silicon region overlying an oxide region. This displacement problem largely precludes the use of available circuit designs and mask sets, in conjunction with the lateral seeding process (as currently practiced), for fabricating SOI ICs.

Thus, space efficient, kink-free SOI devices with easily controlled threshold voltage, as well as fabrication methods which permit the use of available circuit designs and mask sets to form SOI ICs, are an elusive goal.

SUMMARY OF THE INVENTION

The invention involves a new SOI device which allows the kink effect to be avoided and allows control of threshold voltage without the use of large area contacts. The invention also involves a new method for fabricating SOI ICs which employs, if so desired, available circuit designs and available apparatus for delineating a substrate surface with the corresponding circuit patterns, e.g., an IC mask set or a programmed, direct write machine (a computer-controlled machine which directs a beam of energy toward a resist, to directly define a pattern in the resist corresponding to a pattern programmed into the computer).

The inventive SOI device, unlike previous SOI devices, includes an electrically conductive pathway extending from the active volume, through or around the insulating region, to, and terminating in, a non-active region of the semiconductor substrate of the device. In operation, an applied back-gate bias draws kink-inducing charges away from the active volume, through the pathway, and into the non-active region of the substrate, and allows threshold voltage control. Unexpectedly, and despite the presence of the electrical pathway, there is essentially no leakage current (other than a flow of kink-inducing charges) from the active volume to the substrate. Thus, the inventive device remains vertically electrically isolated from other n-channel or other p-channel devices formed on the substrate. In addition, SOI CMOS devices encompassed by the invention avoid both latchup and the kink effect.

The inventive method for fabricating SOI ICs involves forming a precursor substrate surface which includes islands of electrically insulating material, each of which is substantially encircled by a crystallization seeding area of substantially single crystal semiconductor material. The boundaries of the islands are defined, in accordance with the invention, with a first pattern delineating device, such as a mask or a programmed, direct write machine, which is substantially identical to a second pattern delineating device. This second device is one component of an apparatus used in defining (on a substrate surface) the circuit patterns needed to form an IC, such as an IC mask set, the component being used to delineate the device regions, e.g., GASAD (gate-and-source-and-drain) regions, of the IC. A layer of non-single crystal, e.g., polycrystalline or amorphous, semiconductor material is formed on the precursor surface and crystallized by substantially simultaneously melting, and then resolidifying, essentially all of the non-single crystal material on each island and its adjacent seeding area. Alternatively, a layer of substantially amorphous semiconductor material is formed on the precursor surface and heated to a temperature above room temperature but below the melting point of the amorphous material to produce crystallization. The second pattern delineating device is then used to delineate the circuit device regions on the surface of the crystallized material, and the remaining components of the apparatus for defining circuit patterns are used to fabricate circuit components in the crystallized material within the delineated device regions.

BRIEF DESCRIPTION OF THE DRAWINGS

The invention is described with reference to the accompanying drawings, wherein:

FIGS. 12-13 and 14-16 depict, respectively, the use of the non-SORT and SORT processes for forming a FOX on the substrate surface depicted in FIG. 11.

DETAILED DESCRIPTION

Figure 1:
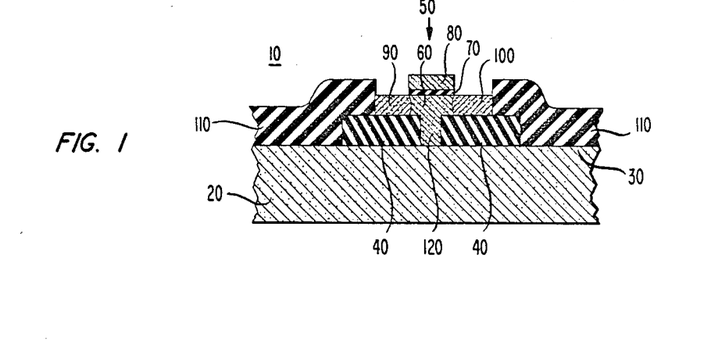
FIGS. 1-3 are, respectively, a cross-sectional view of a first embodiment, a perspective view of a second embodiment, and a cross-sectional view of a third embodiment of the inventive SOI device.
Figure 2:
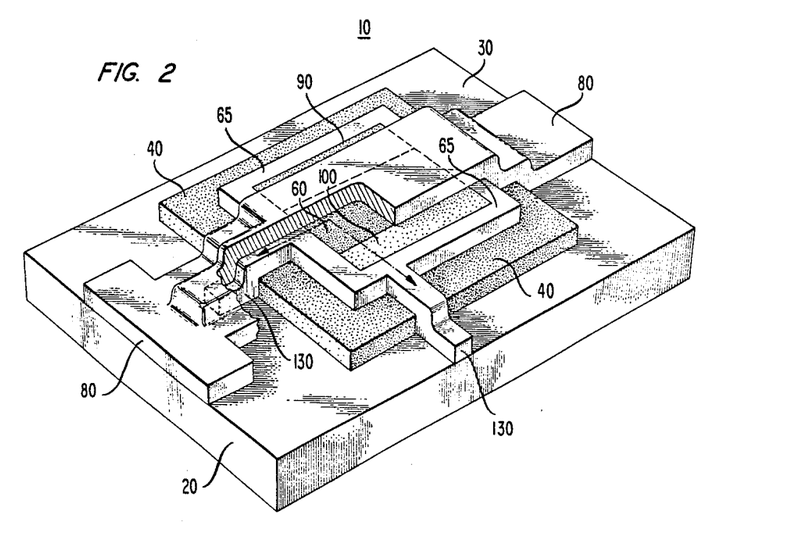
Figure 3:
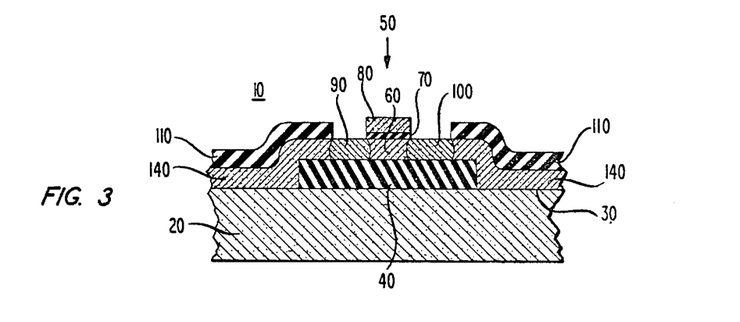

With reference to FIGS. 1-3, the inventive SOI device 10, like other such previously reported devices, includes a substrate 20 having a surface 30 which includes a region 40 (which is, or is not, coplanar with the surrounding portions of the surface 30) of electrically insulating material (material having a bandgap greater than about 3 eV). The substrate 20 includes semiconductor material such as Si, while the region 40 includes, for example, (electrically insulating) $SiO_2$. A semiconductor device 50 which includes an active volume 60 of substantially single crystal semiconductor material, e.g., substantially single crystal Si, overlies the region 40 (intervening regions of material between the active volume 60 and the region 40 are not precluded). (The active volume of a device is a region of the device which conducts more than about fifty percent of the total electric current flowing through the device during device operation. Substantially single crystal semiconductor material is semiconductor material having grain sizes larger than about 1 $\mu$m.) If the semiconductor device 50 is, for example, a MOSFET, then the device also typically includes a thin gate oxide (GOX) 70 supporting a doped, polysilicon gate 80, as well as relatively heavily doped source and drain regions 90 and 100 formed in the active volume 60 on opposite sides of the gate 80. Alternatively, if the device 50 is a MESFET (metal semiconductor FET), then the device includes a metal gate 80 which directly contacts the active volume 60.

Unlike the previously reported SOI devices, the inventive SOI device 10 also includes an electrically conductive pathway extending from the active volume 60 to, and terminating in, a non-active region (a region which conducts less than about fifty percent of the total device current) of the substrate 20. If the SOI device is a MOSFET or MESFET, where the kink-producing charge carriers remain (during operation) in the active volume 60 between the source and drain regions 90 and 100, then the conductive pathway extends from between these regions to provide a pathway for the charge carriers to the substrate 20. This pathway extends either through the insulating region 40, or around it. The resistance of this pathway is less than about 100 kilohms, and preferably less than about 50 kilohms. Resistances greater than about 100 kilohms are undesirable because they often serve to enhance, rather than reduce, the kink effect.

In operation, and despite the presence of the electrically conductive pathway (extending either through or around the insulating region 40), there is, unexpectedly, essentially no leakage current from, for example, either the source 90 or drain 100 of a MOSFET or MESFET to the substrate 20 (provided the applied voltages, including the back-gate bias, are less than the breakdown voltages of the p-n junctions at the source-substrate and drain-substrate interfaces). Thus, during operation, there is no electrical communication through the substrate 20 between the SOI device 10 and other n-channel or other p-channel devices (provided they are laterally electrically isolated from one another) formed on the substrate 20. Moreover, the inventive device permits the achievement of all of the advantages of conventional SOI devices.

If the electrically conductive pathway extends through the insulating region 40, as depicted in FIG. 1, then the pathway includes an aperture 120 extending from directly beneath the active volume 60 through the thickness of the insulating region 40. The aperture is at least partially filled with an electrically conductive material, e.g., semiconductor material such as silicon. (The resistivity of the material and the dimensions of the aperture should, however, result in a resistance of the pathway less than about 100 kilohms.) An insulating region 40 having an aperture through its thickness is formed, for example, by etching a hole through the region 40. Alternatively, such a region 40 is formed by a selective oxidation of a (silicon) substrate which leaves a hole in the (SiO$_2$) region 40. Semiconductor material is deposited into the aperture 120 during the fabrication of active volume 60 which typically involves the deposition of a layer of non-single crystal, e.g., polycrystalline or amorphous, semiconductor material 45 (not shown) onto the surface 30 (and thus into the aperture 120). (Polycrystalline semiconductor material is semiconductor material having grain sizes smaller than about 1 $\mu$m, while amorphous semiconductor material has neither grains nor a crystalline structure.) This deposited material is crystallized, i.e., converted to substantially single crystal semiconductor material, to form the active volume 60 using, for example, the conventional laser processing technique or one of the embodiments of the inventive crystallization process described below.

If the SOI device 10 is a MOSFET or a MESFET, then at least a portion, and preferably all, of the aperture 120 is positioned between the source and drain regions 90 and 100 to provide a pathway for kink-inducing charge carriers to the substrate 20. (If the entire lateral extent of the aperture 120 is positioned beneath the source or drain region, then there is no contact between the semiconductor material within the aperture 120 and the active volume between the source and drain regions, and thus there is no pathway to the substrate 20 for kink-inducing charge carriers. Moreover, source-to-substrate or drain-to-substrate capacitance is undesirably increased.) In addition, the largest lateral dimension of the aperture 120 is preferably smaller than the distance between the closest portions of the source and drain to avoid undesirably large source-to-substrate or drain-to-substrate parasitic capacitance.

If more than one device is formed on the substrate 20, e.g., an IC is formed on the substrate 20, then the SOI device 10 is preferably separated, and laterally electrically isolated, from the other devices. Such lateral isolation is provided, for example, by a field dielectric (FD) 110, i.e., a relatively thick (thick compared to the GOX 70) layer 110 of electrically insulating material, which is formed on the surface 30 (by conventional techniques) and which encircles the semiconductor device 50 (as shown in FIG. 1). If the deposited non-single crystal semiconductor material is polysilicon, then the FD 110 is formed, for example, by oxidizing the subsequently crystallized Si partly or entirely through its thickness, external to the active layer 60, to form an FD of SiO$_2$.

If the electrically conductive pathway extends around the insulating region 40, rather than through it, then the pathway includes electrically conductive material, e.g., semiconductor material, extending from the active volume 60, over the insulating region 40, into contact with a non-active region of the substrate 20. For example, and as depicted in FIG. 2, the electrical pathway (or pathways) includes a tab (or tabs) 130 of semiconductor material projecting from a layer of semiconductor material 65 on the insulating region 40, over the side of the insulating region 40, into contact with the substrate 20. The layer of semiconductor material 65 extends from, and encircles (partially or completely), the active volume 60. (Thus, if the SOI device is a MOSFET or MESFET, the electrical pathway(s) extends from between the source and drain regions in the active volume 60, through the encircling semiconductor material 65, to tab (or tabs) 130, as shown by the arrows in FIG. 2.) The presence of the encircling layer of semiconductor material 65 avoids the need for the tab (or tabs) 130 to project directly from a specific portion of the active volume 60, e.g., to be positioned between the source and drain regions 90 and 100 (the tab or tabs are thus usefully positioned anywhere around the periphery of the encircling semiconductor material 65). In the case of, for example, a MOSFET or MESFET, and in the absence of the encircling semiconductor material 65, the tab (or tabs) 130 projects directly from between the source and drain regions in the active volume 60. The tab (or tabs) 130, as well as the encircling layer of semiconductor material 65, are formed, for example, by selectively etching away, or selectively oxidizing, the deposited, crystallized material surrounding the insulating region 40.

Alternatively, and as depicted in FIG. 3, an electrically conductive pathway extending around the insulating region 40 includes, and extends through, a shroud-like layer of semiconductor material 140 (which includes the active volume 60) overlying the insulating region 40, which contacts the substrate 20. The deposition of the layer 45 of non-single crystal semiconductor material onto the surface 30, and subsequent crystallization of the deposited material, necessarily results in the formation of the layer 140. If an FD is required, then the deposited, crystallized semiconductor material external to the active volume 60 is, for example, oxidized only partially through its thickness (as shown in FIG. 3), to avoid destroying the electrical pathway.

Figure 4:
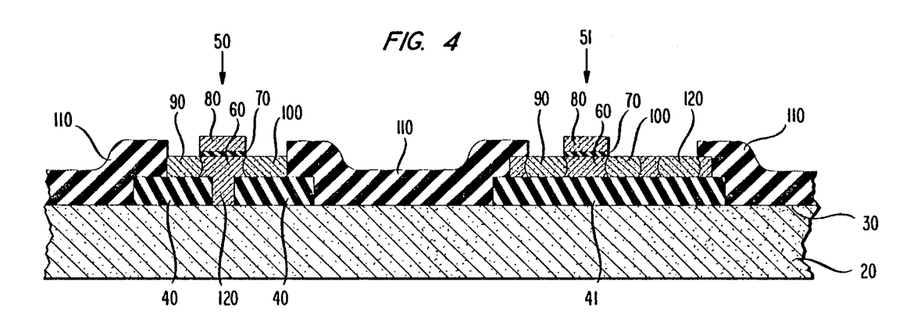
FIGS. 4-5 are cross-sectional views of two embodiments of the inventive SOI CMOS device.
Figure 5:
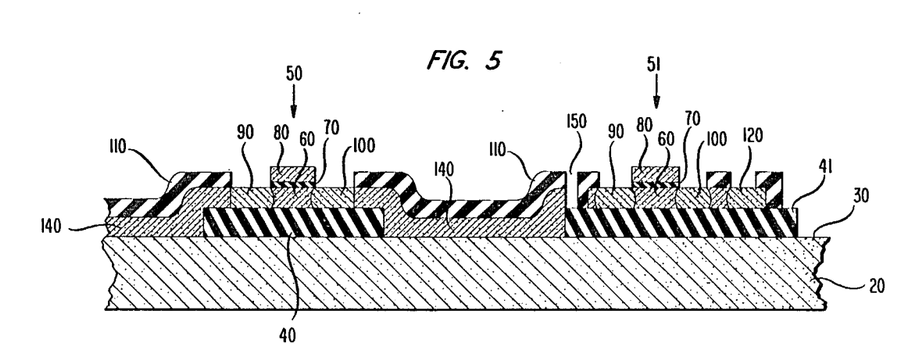

In an SOI CMOS device encompassed by the invention, the need for a large area, low resistance contact in one of the two MOSFETs of the device is avoided by including an electrically conductive pathway in the one MOSFET. (An electrical pathway is preferably not included in both MOSFETs to avoid the possibility of latchup. However, an electrically conductive pathway for each MOSFET is not precluded provided the CMOS device includes a means for preventing latchup.) For example, and as shown in FIG. 4, an SOI CMOS device encompassed by the invention includes the n-channel and p-channel MOSFETs 50 and 51 formed on insulating regions 40 and 41 of a substrate surface 30, separated by an FD 110. One of the MOSFETs, e.g., the p-channel MOSFET 51, includes an encircling, large area, low resistance contact 121 through which a positive voltage is applied to prevent the kink effect and to control threshold voltage. However, the other MOSFET, e.g., the n-channel MOSFET 50, includes, for example, a semiconductor-filled aperture 120 extending through the thickness of its insulating region 40. Alternatively, and as shown in FIG. 5, the MOSFET 50 includes, for example, the shroud-like layer 140 extending over the insulating region 40 to the substrate 20.

If the electrical pathway is through the shroud-like layer 140, then there is preferably no continuity between the layer 140 and the active volume of the MOSFET 51 to avoid the possibility of latchup. An appropriate discontinuity in the layer 140 is achieved, for example, by etching a cut 150 through the thickness of the layer 140, the cut encircling the insulating region 41 on which the MOSFET 51 is formed, thus isolating the MOSFET 51 from the MOSFET 50. Alternatively, a portion of the layer 140 adjacent the MOSFET 51 is oxidized through its thickness, the oxidized portion encircling the MOSFET 51.

The inventive method for fabricating SOI ICs permits the fabrication of such ICs using available circuit designs and available apparatus for delineating (on a substrate surface) the corresponding circuit patterns, e.g., mask sets or programmed, direct write machines. This method involves the formation of a precursor substrate surface which includes islands of electrically insulating material, each of which is substantially encircled by a crystallization seeding area of substantially single crystal semiconductor material. (An island is substantially encircled by a seeding area if seeding area adjoins at least 50 percent, preferably at least 75 percent, and most preferably 100 percent, of the periphery of the island.) The boundaries of the islands are defined, in accordance with the invention, with a first pattern delineating device, such as a mask or a programmed, direct write machine, which is substantially identical, in terms of the pattern it yields, to a second pattern delineating device. The latter device is one component, e.g., one mask, of an apparatus for defining on a substrate the circuit patterns needed to produce an IC, such as an IC mask set, the component being used to define the boundaries of the device regions (each of which includes one or more devices), e.g., GASAD regions, of the IC. Thus, for example, a mask taken from an available IC mask set and normally used to define the boundaries of device regions, is used to define the boundaries of the islands. For purposes of the invention, the first pattern delineating device is substantially identical to the second pattern delineating device provided each island, as delineated by the first delineating device, encompasses the corresponding device region, as delineated by the second delineating device. Furthermore, the distance between each point on the boundary of an island, as delineated by the first delineating device, and the closet point on the boundary of the corresponding device region, as delineated by the second delineating device, prior to the crystallization step (described below), is less than about 2 $\mu$m.

Figure 6:
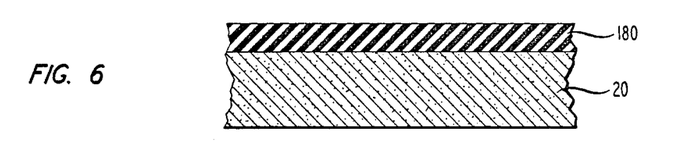
FIGS. 6-7 and 8-10 depict, respectively, the use of the non-SORT and SORT processes for forming insulating islands on the device regions of a substrate.

The particular lithographic technique used to form a precursor surface 30 (see FIGS. 7 and 10) which includes islands 40 of insulating material, each of which is substantially encircled by substantially single crystal semiconductor material 170, is not critical to the invention. Two convenient techniques involve the SORT (selective oxidation for reduced topology) and non-SORT processes (see, e.g., Sze, supra, at pages 462 and 464), which are normally used to form the FD between the device regions of conventional ICs. For example, if the non-SORT process is employed to form the islands of insulating material on a substrate 20, e.g., a substrate of substantially single crystal Si, then a layer 180 of insulating material, such as a layer of $SiO_2$, is initially formed on the surface of the substrate (see FIG. 6). A layer 180 of $SiO_2$ is, for example, grown on the surface of a silicon substrate using conventional thermal oxidation techniques. The thickness of the layer 180 (and thus the thickness of the subsequently formed islands) is preferably greater than about 500 Angstroms. A thickness less than about 500 Angstroms is undesirable because this results in devices, e.g., MOSFETs, formed on the islands which exhibit undesirably large capacitances, such as undesirably large drain-to-substrate-capacitances.

Figure 7:
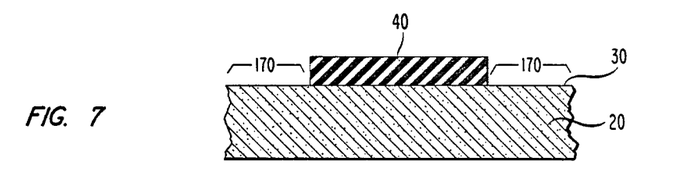

The layer 180 is selectively etched to form the desired islands 40, with each island encircled by the substantially single crystal semiconductor material 170 of the substrate 20 (as shown in FIG. 7). If the layer 180 is, for example, of $SiO_2$, then the islands 40 are readily formed by selectively reactive ion etching the $SiO_2$ in an atmosphere of $CHF_3$. The selective etching is achieved by lithographically delineating the islands with, for example, a mask, referred to here as the island-forming mask, which is substantially identical (as defined above), in terms of the pattern it yields, to the mask of an IC mask set used to define the device regions of an IC, and referred to here as the device mask. (A mask is a pattern-bearing device used in patterning substrates which, when interposed between an energy-sensitive material called a resist and an appropriate source of energy, e.g., electromagnetic radiation, electrons, or ions, yields a desired pattern in the resist, i.e., selected portions of the resist undergo a change in solubility or reactivity in relation to a given developing agent or etchant. After development, the pattern defined in the resist is transferred into an underlying substrate using, for example, an etching procedure.)

Preferably, the boundary of each island extends beyond that of the device region (in all directions) by an amount (less than 2 $\mu$m) which is at least equal to the alignment error inherent in the lithographic procedures used to form the IC component (in the subsequently deposited semiconductor material) on the island. For example, the alignment error associated with present-day, commercial photolithographic techniques is about 1 $\mu$m. Consequently, the boundary of each island preferably extends about 1 $\mu$m (in all directions) beyond the boundary of its corresponding device region. However, the largest lateral extent of an island is preferably less than about 100 $\mu$m, or less than about 10 $\mu$m, depending on the technique used to crystallize the non-single crystal semiconductor material subsequently deposited onto the island (as discussed below).

A convenient non-SORT procedure for forming islands 40 which essentially coincide with the boundaries of the device regions involves the use of a resist which is of opposite tone from that normally used to define the device regions of the corresponding conventional IC. In accordance with this technique, the resist (of opposite tone) is deposited onto the layer 180 and exposed through the device mask. During development (and because of the difference in tone), only the resist external to the device regions is dissolved. Thus, when the insulating layer 180 is etched through the patterned resist, the insulating material external to the device regions is etched away, leaving islands of insulating material 40 covering the device regions.

Figure 8:
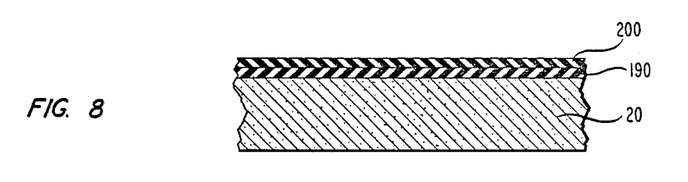

If the SORT process is used to form islands 40 of, for example, $SiO_2$ on a substrate 20 which includes Si then, as shown in FIG. 8, successive layers 190 and 200 of $SiO_2$ and $Si_3N_4$ are initially formed on the substrate. The $SiO_2$ layer 190 is, for example, grown by oxidizing the substrate 20 using conventional thermal oxidation techniques, while the $Si_3N_4$ layer 200 is deposited by conventional chemical vapor deposition techniques. The $SiC_2$ layer 190 serves to protect the underlying Si from collisional and chemical pitting by the deposited $Si_3N_4$ while the $Si_3N_4$ layer 200 (after being patterned) serves as an oxidation mask during the oxidative growth of the $SiO_2$ islands 40 on the device regions.

The thickness of the $SiO_2$ layer 190 ranges from about 100 Angstroms to about 1 $\mu$m. A thickness less than about 100 Angstroms is undesirable because so small a thickness is ineffective to protect the underlying Si against damage from the $Si_3N_4$. A thickness greater than about 1 $\mu$m is undesirable because this often results in the lateral extent of the $SiO_2$ islands being undesirably large.

The thickness of the Si$_3$N$_4$ layer 200 ranges from about 200 Angstroms to about 1 μm. A thickness less than about 200 Angstroms is undesirable because so thin a layer is ineffective to act as an oxidation mask (O$_2$ penetrates the Si$_3$N$_4$ to form SiO$_2$ in regions other than the device regions). A thickness greater than about 1 μm is undesirable because deposition and patterning times are undesirably long. Moreover, so great a thickness produces undesirably large stresses in the (subsequently formed) SiO$_2$ islands, particularly at the birds' beaks 210 of the SiO$_2$ islands (see FIG. 9).

Figure 9:
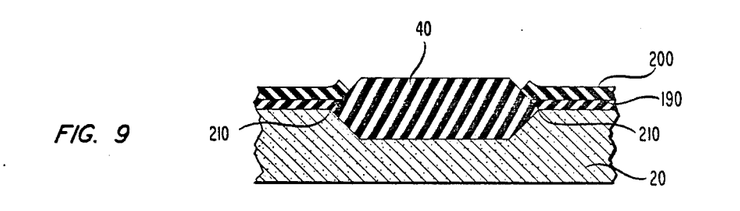
Figure 10:
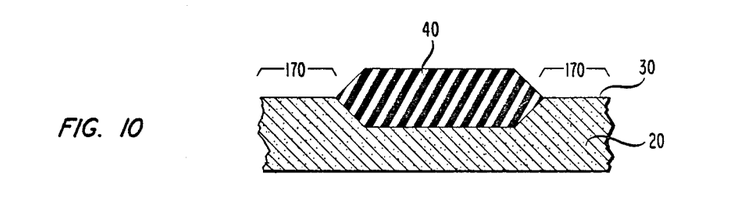

The SiO$_2$ and Si$_3$N$_4$ layers are selectively (using the island-forming mask) dry (plasma assisted) etched in an atmosphere of, for example, CHF$_3$, to expose the regions where islands are to be formed. Thereafter SiO$_2$ islands 40 are grown by conventional thermal oxidation techniques on the exposed regions (see FIG. 9), and the patterned Si$_3$N$_4$ and SiO$_2$ layers are removed with, for example, hot phosphoric acid and hydrofluoric acid, respectively (see FIG. 10). As shown in FIGS. 9 and 10, the islands 40 are generally not coplanar with the surface of the substrate. If desired, the islands 40 are made coplanar by etching back the islands with, for example, hydrofluoric acid. If the SiO$_2$ islands 40 are not etched back, then the thickness of each island ranges from about 500 Angstroms to about 1 μm. A thickness less than about 500 Angstroms is undesirable for the reason given above. A thickness greater than about 1 μm is undesirable because this yields a substrate surface having undesirably large deviations from planarity (a substantially planar surface is preferable during lithographic processing) and also yields undesirably large stresses at the birds' beaks 210. If the SiO$_2$ islands 40 are etched back, then the initial thickness of each SiO$_2$ island is preferably large enough so that after etching, the resulting thickness falls within the specified range.

After the formation of the islands 40, a layer 45 (see FIG. 11) of non-single crystal, i.e., amorphous or polycrystalline, semiconductor material is formed on, e.g., deposited onto, the precursor surface 30. The thickness of the layer 45 ranges from about 200 Angstroms to about 1 μm. Layers thinner than about 200 Angstroms are undesirable because they are often physically discontinuous. Layers thicker than about 1 μm are undesirable because it is difficult to diffuse dopants through so great a thickness of (crystallized) material to form device components, e.g., the source and drain of a MOSFET.

Figure 11:
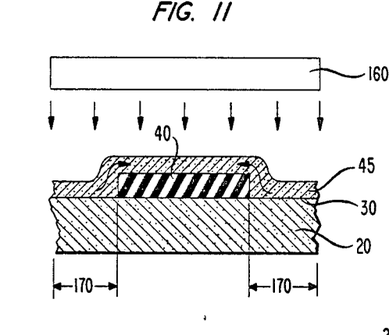
FIG. 11 depicts the inventive crystallization process used in fabricating SOI ICs.

The non-single crystal semiconductor material overlying each island 40 is then crystallized, i.e., converted to substantially single crystal semiconductor material, using one of two techniques. In both techniques, the temperature of the non-single crystal semiconductor material on the island and on the adjacent, encircling seeding area is raised above room temperature (about 23 degrees C.). For example, in the first technique, crystallization is achieved by substantially simultaneously melting (the melting point of all useful materials is above room temperature) essentially all of the non-single crystal material both on the island and on the adjacent, encircling seeding area. (For purposes of the invention, material is substantially simultaneously melted provided melting is not initiated in any portion of the material undergoing melting after any other portion has already resolidified. Essentially all of the material is melted provided at least fifty percent of the material, both on the island and on the adjacent seeding area, undergoes melting.)

Substantially simultaneous melting is achieved, for example, by exposing the substrate to a wide area energy source 160 (depicted in FIG. 11) which is essentially stationary relative to the precursor surface 30, and whose output impinges the whole precursor surface. Thus, essentially all of the non-single crystal semiconductor material covering the surface 30 is substantially simultaneously melted. Alternatively, this is achieved by successively exposing the non-single crystal material contacting each island (or two or more islands) to an energy source which is stationary (during each melting procedure) relative to the precursor surface 30, but whose output impinges just the non-single crystal material covering the island (or islands) and the adjacent seeding area (or areas). Whichever procedure is employed, sufficient energy is employed to melt both the non-single crystal semiconductor material on each island and on each crystallization seeding area 170, and at least a portion of the substantially single crystal semiconductor material in each seeding area.

During subsequent cooling and resolidification, crystallization initially occurs within the melted material on a seeding area 170, and is then radially propagated (from all directions) into the deposited material on the adjacent island 40 (as shown by the arrows in FIG. 11). It has been found that this radial propagation generally extends no more than about 50 μm, and to ensure that essentially all of the deposited material on an island 40 is crystallized, the greatest lateral extent of an island is preferably less than about 100 μm.

Despite the melting of the semiconductor material in the seeding areas 170 (as in the conventional laser processing technique), there is, unexpectedly, little or no displacement of the islands 40 from their original positions.

Among the energies which are useful for melting the layer 45 are radiant energy (electromagnetic radiation), electron beams, and ion beams. The minimum energy per unit mass, $e_m$, which must be absorbed by the semiconductor material of layer 45 to produce melting is given by $$e_m = c(T_{mp} - T) + e_f,$$

where c = specific heat of the semiconductor material, $T_{mp}$ = melting point temperature of the semiconductor material, T = temperature of the semiconductor material prior to energy impingement, e.g., room temperature, and $e_f$ = latent heat of fusion of the semiconductor material. (In regard to $e_m$ see, e.g., C. E. Mortimer, *Chemistry, A Conceptual Approach* (Reinhold, New York, 1967, pages 6 and 168).) Thus, the minimum energy density (energy per unit volume), $e_d$, which must be absorbed by the semiconductor material of layer 45 to achieve melting is just $$e_d = e_m \times \rho$$

where $\rho$ = density of the semiconductor material.

All of the above parameters including c, $T_{mp}$, $e_f$, and $\rho$ are readily found for a particular semiconductor material in standard references such as the *Handbook of Chemistry and Physics*, Robert C. Weast, ed., 63rd edition (1982-83). Therefore, $e_d$ is readily calculated. For example, in the case of polysilicon (initially at a temperature of, for example, 23 degrees C.), the calculated minimum energy density is $5.6 \times 10^3$ joules/cm$^3$. Consequently, for a layer of polysilicon having a thickness of 1 μm, the minimum energy intensity (energy per unit area) required to produce melting is 0.56 joules/cm$^2$ ($=5.6 \times 10^3$ joules-cm$^{-3} \times 1$ μm), from which the power intensity (power per unit area emitted by the energy source) and exposure time are readily determined (power intensity x exposure time=energy intensity).

An energy source which provides just the minimum energy density will not, in general, produce melting because at least a portion of the incident energy will be dissipated through, for example, heat conduction, rather than absorbed. Thus, the energy density required to produce melting must generally be determined empirically by exposing control samples to increasing energy densities. However, the calculated energy density provides a useful starting point in the empirical procedure.

In the case of, for example, polysilicon, it has been found that the minimum energy density required to actually produce melting is about $10^5$ joules/cm$^3$. Thus, for a 1 μm-thick layer of polysilicon, the minimum required energy intensity is about 10 joules/cm$^2$ ($=10^5$ joules-cm$^{-3} \times 1$ μm). An even higher energy intensity is easily achieved and melting readily produced, for example, with a stationary, conventional tungsten lamp, emitting light in the wavelength range 0.3 μm to 1.5 μm (with peak power centered about 1.1 μm), at a power intensity of about 60 watts/cm$^2$, and using an exposure time of about 4 seconds (yielding an energy intensity of 240 joules/cm$^2$).

If the non-single crystal material overlying an island 40 and its adjacent seeding area is substantially amorphous (at least fifty percent of the noncrystalline material is amorphous) rather than polycrystalline, then crystallization is readily achieved, with little or no movement of the island, by raising the temperature of the amorphous material above room temperature but below the melting point of the amorphous material. Raising the temperature of any portion of the amorphous material overlying and contacting the seeding area results in the crystallization of this portion, i.e., a crystallization front propagates through the thickness of the portion, starting at the interface between the portion and the underlying substantially single crystal semiconductor material of the seeding area. The propagation speed of this front increases as the temperature of the portion is increased. If the temperature of any portion of the amorphous material overlying and contacting the island 40 is also raised, either simultaneously with, or after increasing the temperature of (and thus crystallizing) a contiguous portion of amorphous material overlying and contacting the seeding area, then two effects occur. First, a crystallization front propagates laterally from the contiguous portion of crystallized (formerly amorphous) material overlying and contacting the seeding area into the amorphous material overlying the island. Secondly, a polycrystallization front (a front behind which amorphous material has been converted to polycrystalline material) propagates through the thickness of the portion of amorphous material overlying the island, starting at the amorphous material/island interface. The propagation speed of the polycrystallization front also increases with temperature, but at a different rate from that of the crystallization front. In order to convert the portion of amorphous material overlying and contacting the island into substantially single crystal material, it has been found that the ratio of the propagation speed of the crystallization front laterally traversing the portion to the propagation speed of a polycrystallization front traversing the thickness of the portion should be greater than or equal to the ratio of the (corresponding) lateral dimension of the portion to the smallest thickness (if thickness is nonuniform) of the portion. If, for example, the temperature of all of the amorphous material overlying an island and its encircling seeding area is simultaneously raised, then a single crystallization front, initially encircling the island, will propagate (from all directions) through the amorphous material overlying the island, from the periphery of the island toward the center of the island. No portion of this front will traverse more than half the largest lateral extent, e.g. length or width, of the island. Consequently, in this case, crystallization is achieved provided the ratio of propagation speeds is greater than or equal to the ratio of one-half the largest lateral dimension of the island to the smallest thickness of the amorphous material overlying the island. However, it must be emphasized that simultaneous heating is not necessary to achieve crystallization. Rather, it is only necessary that any portion of the amorphous material overlying the island be heated simultaneously with, or subsequent to, the heating (and thus crystallization) of a contiguous portion of amorphous material overlying the adjacent seeding area.

It has been found that a crystallization front will propagate no more than about 5 μm from the periphery toward the center of the amorphous material overlying an island. Consequently, to crystallize all the amorphous material overlying an island using, for example, a crystallization front or fronts propagating from opposed sides of the island, the largest lateral dimension of an island is preferably less than or equal to about 10 μm.

In general, the temperature profile in the amorphous material overlying an island and its adjacent seeding area, needed to produce the necessary ratio of propagation speeds leading to crystallization, is determined empirically. For example, a given temperature profile is produced in the amorphous material overlying the islands and seeding areas of control samples, and scanning electron micrographs (SEMs) of cross sections of the control samples are made (the crystallization and polycrystallization fronts are readily seen in SEMs) at different instants in time, which permits a measurement of the respective propagation speeds. Once a temperature profile which produces the desired propagation speeds has been found, a knowledge of the propagation speed of the crystallization front, of the dimensions of the island, and of the thickness of the amorphous material, permits a calculation of the minimum time needed to crystallize the amorphous material overlying the island.

Using the above empirical technique, it has been found that one convenient technique for crystallizing amorphous silicon overlying an insulating island and its adjacent seeding area involves uniformly heating (using, for example, any of the energies and energy sources useful for melting) the amorphous silicon overlying both the island and the seeding area to a temperature ranging from about 500 to about 700 degrees C. Temperatures lower than about 500 degrees C. are less desirable, although not precluded, because they require undesirably long heating times to achieve crystallization.

Temperatures greater than about 700 degrees C. are undesirable because they result in an undesirably large amount of amorphous silicon being converted to polycrystalline silicon rather than substantially single crystal silicon.

Amorphous semiconductor material is readily deposited onto the precursor surface 30 (prior to crystallization) using conventional chemical vapor deposition techniques. Alternatively, polycrystalline semiconductor material is deposited onto the surface 30 and converted to amorphous material through impact with ions. The ions, ion dosages and ion energies needed to convert a particular thickness of a particular polycrystalline material to amorphous material are generally determined empirically. One convenient empirical technique is to subject control samples of the thickness of polycrystalline material (to be converted to amorphous material) to various ions, ion dosages and ion energy levels and then make scanning electron micrographs (SEMs) of cross sections of the control samples. The interface between the resulting amorphous material and any residual polycrystalline material is readily seen in such SEMs. Using this technique, it has been found, for example, that a 0.3 $\mu$m thick layer of polycrystalline silicon is made amorphous by implanting two sets of $Si^+$ ions into the layer. The energies of the ions associated with one implant should be about 60 keV, while the energies of the ions associated with the other implant should be about 160 keV. The corresponding dosage level for each implant should be about $2\times 10^{15}$ cm$^{-22}$.

Figure 12:
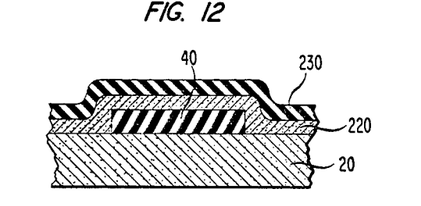
Figure 13:
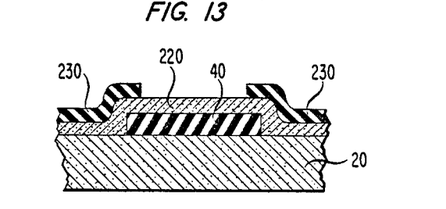
Figure 14:
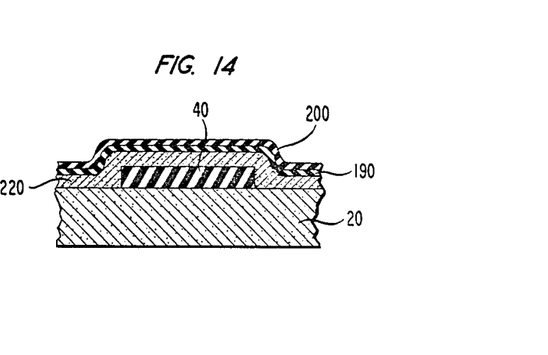
Figure 15:
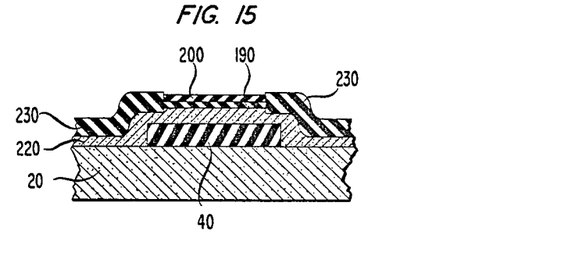
Figure 16:
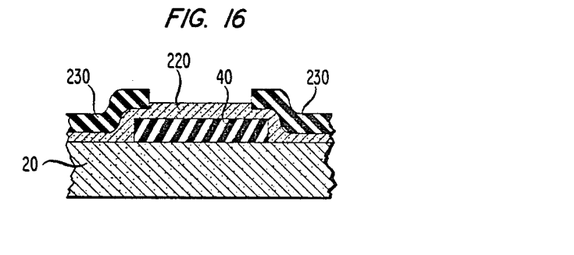

The crystallization of the layer 45 results in the formation of substantially single crystal semiconductor material 220 covering each island 40, which is now further processed with the IC mask set (which includes the device mask) to complete the fabrication of the SOI IC. That is, the device mask (of the IC mask set) is used to form a FD 230, i.e., a layer of electrically insulating material 230 (see FIGS. 13 and 16), which is external to, and encircles, a device region (a region which is to contain one or more devices) in the substantially single crystal semiconductor material 220 covering each island 40. If, for example, the non-SORT process is used to form the FD 230, and if the crystallized layer 220 is of Si, then this layer is oxidized partially through its thickness, and the oxide covering the device regions is selectively (using the device mask) lithographically removed (see FIGS. 12 and 13). Alternatively, if the SORT process is used to form the FD 230, then (as shown in FIGS. 14-16), for example, successive layers 190 and 200 of $SiO_2$ and $Si_3N_4$ are formed on the layer 230, the $SiO_2$ and $Si_3N_4$ are patterned (using the device mask) to expose the crystallized layer 220 external to the device regions, and the exposed regions of the layer 220 are oxidized to form the FD. After the formation of the FD, the remaining masks of the IC mask set are used to form an IC component in the substantially single crystal material 220 overlying each island 40.

EXAMPLE

The following shows that the inventive method for fabricating SOI devices avoids the displacement problem exhibited by the conventional lateral seeding process.

A p-type, 3-inch silicon wafer, having an upper major surface with a (100) orientation, was heated in an oven at 1000 degrees C. for 40 minutes to form a layer of $SiO_2$ on the wafer's surface. The thickness of the $SiO_2$ layer was measured with an ellipsometer and found to be about 500 Angstroms. Conventional low pressure chemical vapor deposition (LPCVD) techniques were then used to deposit a layer of $Si_3N_4$ onto the oxidized, upper major surface of the wafer. The thickness of the $Si_3N_4$ was also measured with an ellipsometer and found to be about 1250 Angstroms. Then, a 1 $\mu$m-thick layer of HPR-204 positive photoresist (the photoresist was purchased from the Hunt Chemical Corporation of Garden City, Long Island) was spin-deposited onto the $Si_3N_4$.

The photoresist was exposed to light having a wavelength of about 4000 Angstroms through a mask to define a periodic array of rectangles in the photoresist. Each rectangle of the array was 6 $\mu$m in width and 16 $\mu$m in length. The center-to-center spacing between the rectangles in a first direction was about 20 $\mu$m, while the center-to-center spacing in a second direction, transverse to the first, was about 28 $\mu$m. The resist was developed with LSI developer (for the HPR-204 photoresist), also sold by Hunt Chemical Corporation, for 2 minutes, to produce a corresponding array of rectangular apertures in the resist. The pattern in the resist was then transferred into the $Si_3N_4$ and $SiO_2$ layers by plasma etching these layers, through the patterned resist, in an atmosphere of $CHF_3$. The resist was removed with a solvent which includes $H_2SO_4$ and $H_2O_2$.

The wafer was then oxidized in a wet ambient (using the patterned layer of $Si_3N_4$ as an oxidation mask), with conventional techniques, at a temperature of 1000 degrees C. for about 5 hours, to produce a periodic array of rectangular oxide islands on the surface of the wafer. The thickness of these oxide islands was measured with an ellipsometer and found to be about 1 $\mu$m. About half the thickness of the oxide islands extended above the original surface of the wafer.

In order to achieve a substantially planar wafer surface, the oxide islands were etched back using a 3-step process. During the first step, the oxide islands were etched with buffered HF to reduce the thickness of the islands by about 2000 Angstroms, and during the second step, the patterned $Si_3N_4$ layer was etched away with hot phosphoric acid. During the third step, the oxide islands were again etched with buffered HF to further reduce the thickness of the islands by about 2000 Angstroms. The patterned $SiO_2$ layer (originally lying beneath the $Si_3N_4$) was also etched away during the third step.

A 4000 Angstrom-thick layer of polysilicon was deposited onto the wafer by conventional LPCVD techniques, and annealed in an $N_2$ atmosphere, at 1100 degrees C., for 30 minutes. A portion of the deposited polysilicon was then crystallized by shining a stationary argon laser (stationary relative to the wafer surface), emitting light at a wavelength of about 488 nanometers, at a power of about 10 watts, onto the polysilicon. The laser, which produced a spot size of about 60 $\mu$m, was operated for about 0.5 seconds. The energy density within the laser spot was sufficient to melt the polysilicon impinged by the spot.

The wafer was etched for about 5 seconds with an etchant which includes 75 grams of $CrO_3$ dissolved in a solution which includes 1 liter of $H_2O$ and 2 liters of HF. This etchant preferentially etches grain boundaries, thus making grain boundaries visible under an optical microscope.

The etched wafer was observed, and photographed, under an optical microscope at a magnification of about 847. The photograph revealed almost a complete absence of grain boundaries within the polysilicon impinged by the laser spot, but did reveal a large number of grain boundaries within the polysilicon outside the laser spot. Thus, the polysilicon impinged by the laser light had been crystallized.

The center-to-center spacing between adjacent oxide islands in the photograph was measured with a ruler (the scale was 1 inch=30 $\mu$m). In particular, the spacing between two adjacent islands outside the laser spot, between two adjacent islands within the laser spot, and between an island within the laser spot and an adjacent island outside the laser spot was measured. In all cases, the spacing in the first direction was about 20 $\mu$m, while the spacing in the second direction was about 28 $\mu$m. Thus, there was essentially no movement of any of the islands.

What is claimed is:

1. A device, comprising:
   a substrate which includes semiconductor material, a first region of electrically insulating material, and a non-active region; and
   a first volume of substantially single-crystal semiconductor material overlying said region of insulating material, CHARACTERIZED IN THAT
   said device further comprises an electrically conductive pathway, having a resistance less than about 100 kilohms, extending from said volume to, and terminating in, said non-active region of said substrate, and an electrical contact to said substrate adapted for applying a back-gate bias to said device.

2. The device of claim 1 wherein said volume includes two relatively heavily doped, spatially separated regions, and said conductive pathway extends from between said regions.

3. The device of claim 1 wherein said pathway includes an aperture extending through a thickness of said insulating region, which aperture is at least partially filled with semiconductor material.

4. The device of claim 1 wherein said pathway includes semiconductor material extending from said volume, over said insulating region, and into contact with said substrate.

5. The device of claim 1 further comprising a field effect transistor formed in and on said first volume.

6. The device of claim 5 wherein said field effect transistor is a metal-oxide-semiconductor field effect transistor.

7. The device of claim 5 wherein said field effect transistor is a metal-semiconductor field effect transistor.

8. The device of claim 1, further comprising:
   a second region of electrically insulating material, which second region is spaced from said first region of insulating material; and
   a second volume of substantially single-crystal semiconductor material contacting said second region of insulating material, the conductivity of said second volume being of opposite type to that of the first volume.

* * * * *